(12) United States Patent
Ishihara et al.

(10) Patent No.: US 10,247,784 B2
(45) Date of Patent: Apr. 2, 2019

(54) SECONDARY BATTERY STATUS DETECTION DEVICE AND SECONDARY BATTERY STATUS DETECTION METHOD

(71) Applicants: FURUKAWA ELECTRIC CO., LTD., Tokyo (JP); FURUKAWA AUTOMOTIVE SYSTEMS INC., Shiga (JP)

(72) Inventors: Hideaki Ishihara, Shiga (JP); Etsuzo Sato, Shiga (JP)

(73) Assignees: FURUKAWA ELECTRIC CO., LTD., Tokyo (JP); FURUKAWA AUTOMOTIVE SYSTEMS INC., Shiga (JP)

(*) Notice: Subject to any disclaimer, the term of this patent is extended or adjusted under 35 U.S.C. 154(b) by 532 days.

(21) Appl. No.: 14/973,546

(22) Filed: Dec. 17, 2015

(65) Prior Publication Data

US 2016/0103182 A1    Apr. 14, 2016

Related U.S. Application Data

(63) Continuation of application No. PCT/JP2014/064191, filed on May 28, 2014.

(30) Foreign Application Priority Data

Jun. 18, 2013   (JP) .................... 2013-127848

(51) Int. Cl.
*G01N 27/416*   (2006.01)
*G01R 31/36*    (2019.01)

(52) U.S. Cl.
CPC ....... *G01R 31/3624* (2013.01); *G01R 31/361* (2013.01); *G01R 31/362* (2013.01); *G01R 31/3686* (2013.01)

(58) Field of Classification Search
CPC ............ G01R 31/3662; G01R 31/3648; G01R 31/3658; G01R 31/3624; G01R 31/3675;
(Continued)

(56) References Cited

U.S. PATENT DOCUMENTS

| | | | | |
|---|---|---|---|---|
| 5,412,323 A | * | 5/1995 | Kato ................ | G01R 31/3624 320/152 |
| 6,331,762 B1 | * | 12/2001 | Bertness ............ | G01R 31/3627 320/134 |

(Continued)

FOREIGN PATENT DOCUMENTS

| | | |
|---|---|---|
| JP | 2000270402 A | 9/2000 |
| JP | 2005188965 A | 7/2005 |

(Continued)

OTHER PUBLICATIONS

International Search Report for PCT Application Serial No. PCT/JP2014/064191 dated Aug. 5, 2014, 4 pages.

*Primary Examiner* — Thang X Le
(74) *Attorney, Agent, or Firm* — Amin, Turocy & Watson, LLP

(57) ABSTRACT

[Summary]
[Object] To accurately detect a state of a secondary battery when the secondary battery is mounted on a vehicle.
[Organization] In a secondary battery state detecting device 1 detecting a state of a secondary battery 14 which is mounted on a vehicle, a first operation mode being an initial operation mode in a case newly connected to the secondary battery and a second operation mode being a normal operation mode after the first operation mode are included, and an initial state detecting unit (control part 10) which makes the operation mode transit to the first operation mode, and detects an initial state of the secondary battery with reference to a terminal voltage of the secondary battery in a case connected to the secondary battery; and a normal state
(Continued)

detecting unit (control part 10) which makes the operation mode transit to the second operation mode, and detects the state of the secondary battery at a normal time based on the terminal voltage and a charge/discharge current of the secondary battery at a predetermined timing after the state of the secondary battery is detected by the initial state detecting unit are included.

6 Claims, 7 Drawing Sheets

(58) Field of Classification Search
CPC ............ G01R 31/3679; G01R 31/3686; G01R 31/361; G01R 31/362; G01R 31/36; G01R 31/4285; H01M 10/4285; H01M 10/486; H01M 10/42; H01M 10/48; H01M 10/484; B60L 2240/80; B60L 2240/549; B60L 2240/547; B60L 2240/545
USPC .................................................. 324/426–437
See application file for complete search history.

(56) References Cited

U.S. PATENT DOCUMENTS

| | | | | |
|---|---|---|---|---|
| 6,563,318 | B2* | 5/2003 | Kawakami | G01R 31/3662 320/132 |
| 2007/0013347 | A1* | 1/2007 | Kamohara | B60K 6/48 320/160 |
| 2009/0259419 | A1* | 10/2009 | Kasai | B62D 5/0481 702/63 |
| 2010/0318252 | A1* | 12/2010 | Izumi | B60K 6/365 701/22 |
| 2016/0303977 | A1* | 10/2016 | Kudo | B60L 3/0046 |

FOREIGN PATENT DOCUMENTS

| | | |
|---|---|---|
| JP | 2007078525 A | 3/2007 |
| JP | 2008260506 A | 10/2008 |
| JP | 2013038831 A | 2/2013 |

* cited by examiner

SECONDARY BATTERY STATUS DETECTION DEVICE AND SECONDARY BATTERY STATUS DETECTION METHOD

CROSS-REFERENCE TO RELATED APPLICATION

The subject application is a continuation of, and claims priority to, PCT Application Serial No. PCT/JP2014/064191, filed May 28, 2014, and entitled "SECONDARY BATTERY STATUS DETECTION DEVICE AND SECONDARY BATTERY STATUS DETECTION METHOD", which claims priority to Japanese Patent Application Serial No. 2013-127848, filed Jun. 18, 2013, the disclosures of which are incorporated herein by reference in their entirety.

TECHNICAL FIELD

The present invention relates to a secondary battery state detecting device and a secondary battery state detecting method.

BACKGROUND ART

In Patent Document 1, a technology to detect a state of charge (SOC) of a lead-acid battery is disclosed. In this technology, a relational expression between a terminal voltage and a discharge current is found in advance as for a lead-acid battery whose SOC is already known, and a coefficient of the relational expression is found from a state when the SOC is different. The terminal voltage and the discharge current are applied to the found relational expression, and thereby, it is possible to find the SOC of the lead-acid battery at an arbitrary time.

PRIOR ART DOCUMENT

Patent Document

Patent Document 1: Japanese Patent Application Laid-open No. 2005-188965

SUMMARY OF THE INVENTION

Problems to be Solved by the Invention

Incidentally, in an assembling process of a vehicle, it is judged whether or not a secondary battery is normal based on a state detection result by a secondary battery state detecting device. When it is not normal, it is judged to be defective, and there is a case when the secondary battery is exchanged into a new secondary battery.

When the state detection device is attached to the secondary battery, there is a case when the state of the secondary battery is detected at times when a state in which a contact between a terminal of the secondary battery and the state detecting device is not good occurs, and when a state in which electric power is supplied from the secondary battery to a load occurs. In such cases, a normal detection cannot be performed, and therefore, the secondary battery is judged to be abnormal by mistake, and there is a problem in which the exchange of the secondary battery is executed though the exchange is not necessary.

An object of the present invention is to provide a secondary battery state detecting device and a secondary battery state detecting method capable of accurately detecting a state of a secondary battery when the secondary battery is mounted on a vehicle.

Means for Solving the Problems

To solve the above-sated problems, in a secondary battery state detecting device detecting a state of a secondary battery mounted on a vehicle, the present invention is characterized in that: a first operation mode being an initial operation mode in a case newly connected to the secondary battery, and a second operation mode being a normal operation mode after the first operation mode are included, the secondary battery state detecting device, has: an initial state detecting unit which makes the operation mode transit to the first operation mode, and detects an initial state of the secondary battery with reference to a terminal voltage of the secondary battery in a case connected to the secondary battery; and a normal state detecting unit which makes the operation mode transit to the second operation mode, and detects the state of the secondary battery at a normal time based on the terminal voltage and a charge/discharge current of the secondary battery at a predetermined timing after the state of the secondary battery is detected by the initial state detecting unit.

With such a constitution, it is possible to accurately detect the state of the secondary battery when the secondary battery is mounted on the vehicle.

Further, one aspect of the present invention is characterized in that the normal state detecting unit is transit to the second operation mode when an ignition switch of the vehicle is turned into on state.

With such a constitution, it is possible to detect the state during a period when the state of the secondary battery is stable.

Further, one aspect of the present invention is characterized in that when the initial state of the secondary battery is judged to be not normal, the initial state detecting unit presents information indicating the state via a higher device.

With such a constitution, it is possible to notify the workers that the secondary battery is not normal.

Further, one aspect of the present invention is characterized in that the initial state detecting unit detects the state of the secondary battery in plural times, and detects the state of the secondary battery based on an average value of the plural detections.

With such a constitution, it is possible to accurately detect the state of the secondary battery based on the average value of the plural times.

Further, one aspect of the present invention is characterized in that the initial state detecting unit detects the state of the secondary battery in plural times, and detects the state of the secondary battery based on a maximum value of the plural detections.

With such a constitution, it is possible to accurately detect the state of the secondary battery based on the maximum value of the plural times.

Further, in a secondary battery state detecting method detecting a state of a secondary battery mounted on a vehicle, the present invention is characterized in that: a first operation mode being an initial operation mode in a case newly connected to the secondary battery, and a second operation mode being a normal operation mode after the first operation mode are included, and the secondary battery state detecting method has: an initial state detecting step which makes the operation mode transit to the first operation mode, and detects an initial state of the secondary battery with reference to a terminal voltage of the secondary battery in a case connected to the secondary battery; and a normal state detecting step which makes the operation mode transit to the second operation mode, and detects the state of the secondary battery at a normal time based on the terminal voltage and a charge/discharge current of the secondary battery at a predetermined timing after the state of the secondary battery is detected in the initial state detecting step.

With such a method, it is possible to accurately detect the state of the secondary battery when the secondary battery is mounted on the vehicle.

Effect of the Invention

According to the present invention, it becomes possible to provide a secondary battery state detecting device and a secondary battery state detecting method capable of accurately detecting a state of a secondary battery when the secondary battery is mounted on a vehicle.

BEST MODE FOR CARRYING OUT THE INVENTION

Next, an embodiment of the present invention will be described.

(A) Description of Constitution of Embodiment

Figure 1:
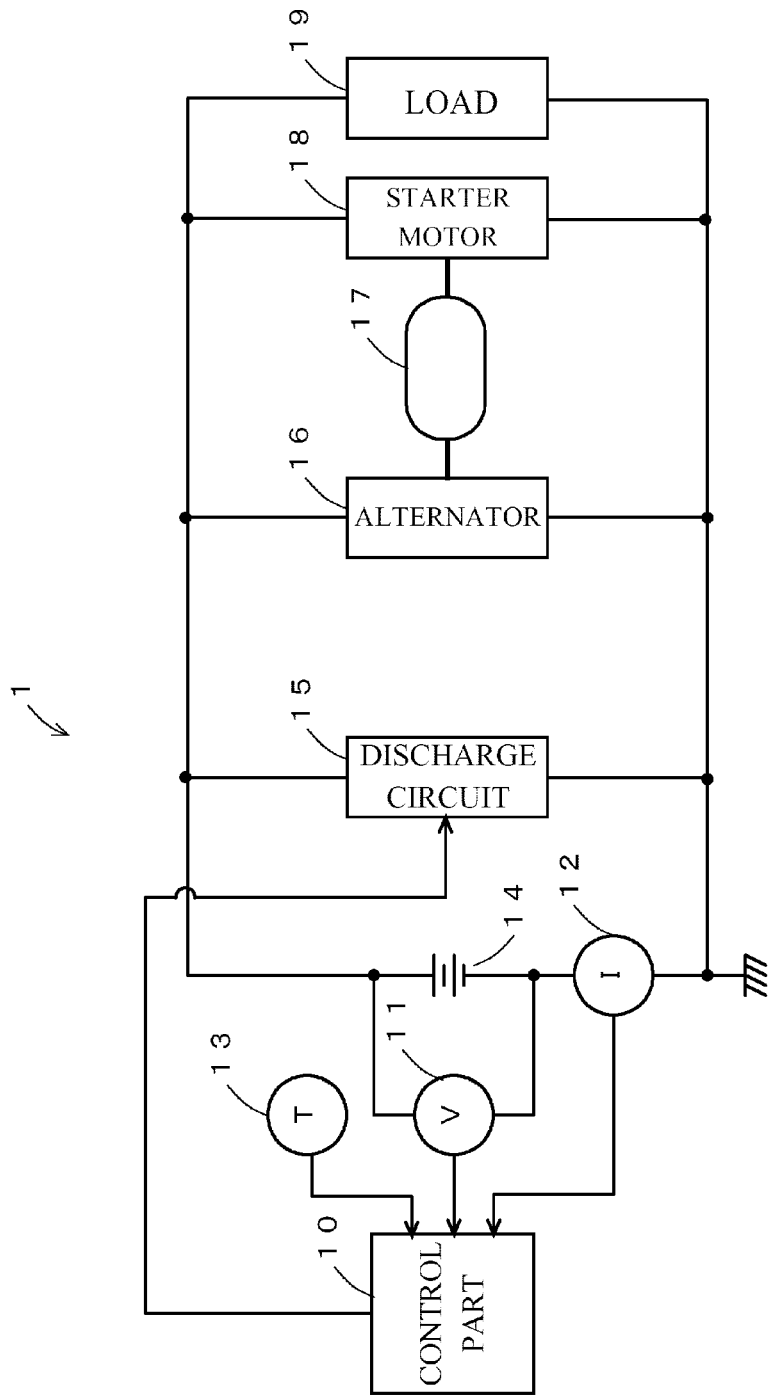
FIG. 1 is a view illustrating a configuration example of a secondary battery state detecting device according to an embodiment of the present invention.

FIG. 1 is a view illustrating a power supply system of a vehicle having a secondary battery state detecting device according to an embodiment of the present invention. In this drawing, a secondary battery state detecting device 1 includes a control part 10, a voltage sensor 11, a current sensor 12, a temperature sensor 13, and a discharge circuit 15 as major components, and detects a state of a secondary battery 14. Here, the control part 10 refers to outputs from the voltage sensor 11, the current sensor 12, and the temperature sensor 13 to detect the state of the secondary battery 14. The voltage sensor 11 detects a terminal voltage of the secondary battery 14, and notifies the control part 10. The current sensor 12 detects a current flowing in the secondary battery 14, and notifies the control part 10. The temperature sensor 13 detects an environmental temperature of the secondary battery 14 in itself or a periphery thereof, and notifies the control part 10. The discharge circuit 15 is made up of, for example, a semiconductor switch, a resistance element, and so on which are connected in series, and it makes the secondary battery 14 intermittently discharge by an on/off control of the semiconductor switch by the control part 10.

The secondary battery 14 is made up of, for example, a lead-acid battery, a nickel-cadmium battery, a nickel hydride battery, a lithium ion battery, or the like, is charged by an alternator 16, drives a starter motor 18 to start an engine and supplies electric power to a load 19. The alternator 16 is driven by an engine 17, generates an alternating-current power, converts into a direct-current power by a rectifying circuit, and charges the secondary battery 14.

The engine 17 is made up of, for example, a reciprocal engine such as a gasoline engine and a diesel engine, or a rotary engine, and so on, started by the starter motor 18, drives a driving wheel via a transmission to provide a vehicle with a propulsive force, and generates electric power by driving the alternator 16. The starter motor 18 is made up of, for example, a direct current motor, generates a rotational force by the electric power supplied from the secondary battery 14, and starts the engine 17. The load 19 is made up of, for example, an electric steering motor, a defogger, an ignition coil, a car audio, a car navigation, and so on, and operated by the electric power from the secondary battery 14. Note that an electric motor may be used instead of the engine 17.

Figure 2:
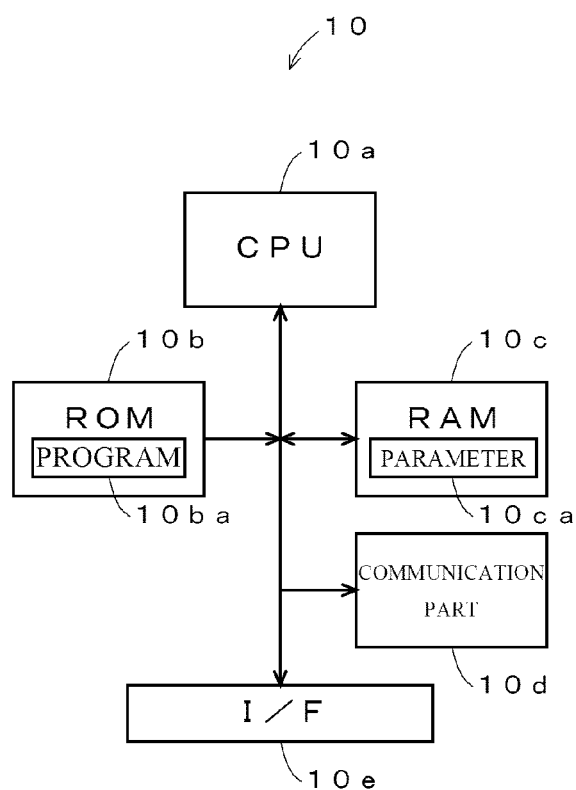
FIG. 2 is a block diagram illustrating a detailed configuration example of a control part in FIG. 1.

FIG. 2 is a view illustrating a detailed configuration example of the control part 10 illustrated in FIG. 1. As illustrated in this drawing, the control part 10 includes a CPU (Central Processing Unit) 10a, a ROM (Read Only Memory) 10b, a RAM (Random Access Memory) 10c, a communication part 10d, and an I/F (Interface) 10e. Here, the CPU 10a controls each part based on programs 10ba stored at the ROM 10b. The ROM 10b is made up of a semiconductor memory, and so on, and stores the programs 10ba, and so on. The RAM 10c is made up of the semiconductor memory, and so on, and stores data generated when the programs 10ba are executed, and parameters 10ca of later-described tables, numerical formulas, or the like. The communication part 10d performs communications with ECU (Electronic Control Unit) being a higher device and so on, and notifies detected information to the higher device. The I/F 10e converts signals supplied from the voltage sensor 11, the current sensor 12, and the temperature sensor 13 into digital signals, downloads them, and supplies a drive current to the discharge circuit 15 to control it.

(B) Description of Principles of Operations of Embodiment

Figure 3:
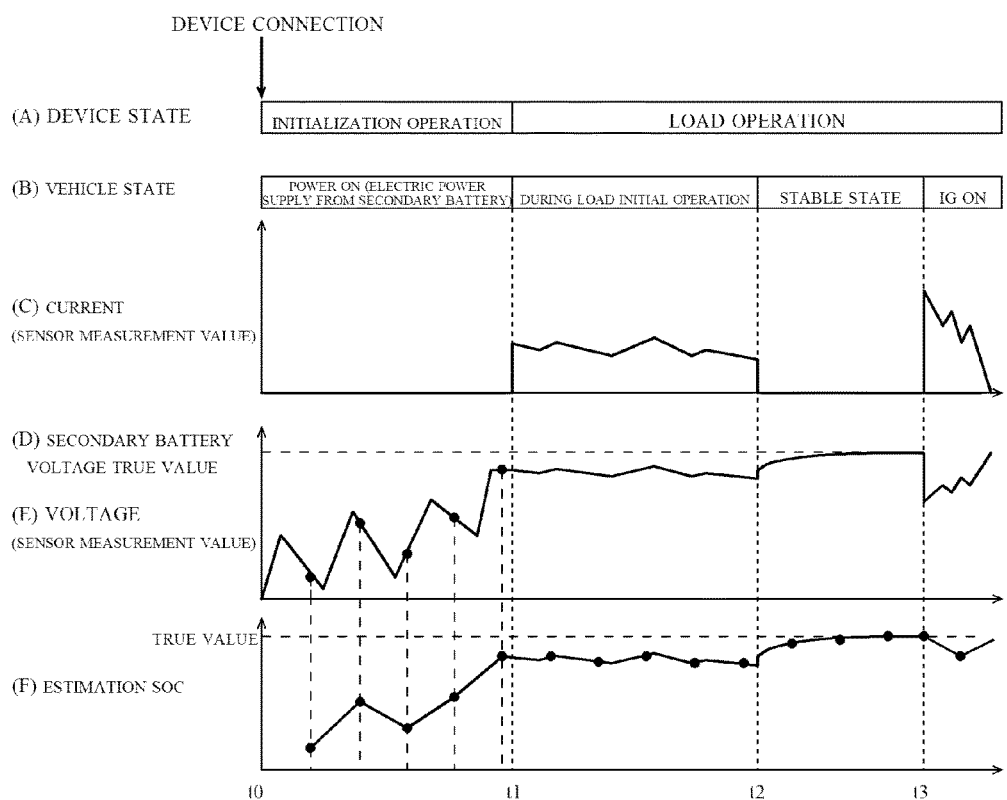
FIG. 3 is a view illustrating a change of a voltage and a current at a vehicle assembling time.
Figure 4:
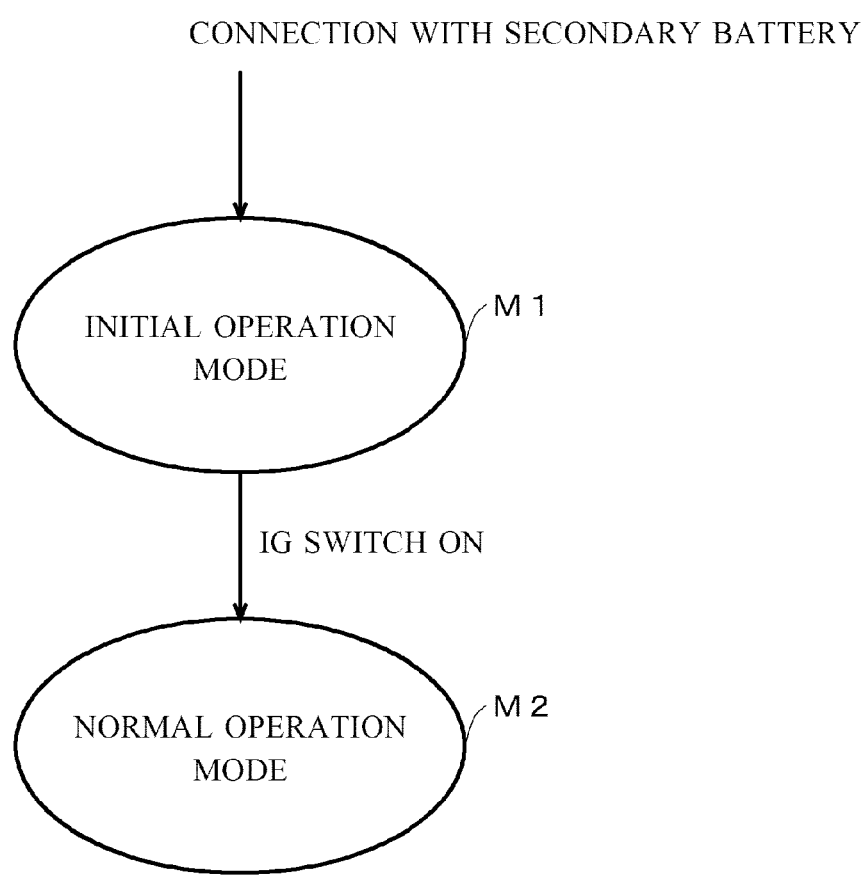
FIG. 4 is a view illustrating a transition example of an operation mode of the embodiment of the present invention.

Next, principles of operations of the embodiment are described with reference to the drawings. FIG. 3 is a timing chart to explain operations when the secondary battery state detecting device 1 is attached to the secondary battery 14 at an assembling process of a vehicle in FIG. 3. Note that in the assembling process of the vehicle, at first, the load 19 is attached, and the secondary battery state detecting device 1 is attached. After the secondary battery 14 is mounted, the secondary battery state detecting device 1 and the load 19 are connected to the secondary battery 14. As illustrated in FIG. 3, it is assumed that the connection of the secondary battery state detecting device 1 to the secondary battery 14 is started at a timing t0, then as illustrated in FIG. 3(B), electric power is supplied from the secondary battery 14 to the secondary battery state detecting device 1, and the secondary battery state detecting device 1 becomes in an initialization operation, then is transit to an initial operation mode M1 relating to a state detection of the secondary battery 14. Note that the initialization operation is, for example, an operation to read out the program 10ba stored at the ROM 10b, loads at the RAM 10c to make it an operation enable state. Besides, the initial operation mode M1 is an operation mode to be transit to when the secondary battery state detecting device 1 is newly connected to the secondary battery 14 as illustrated in FIG. 4, and as it is described later, it is an operation mode in which the SOCs are estimated from the terminal voltage of the secondary battery 14 to store at the RAM 10, and for example, a maximum value thereof is presented as an initial SOC.

During the initialization operation, the voltage is measured by the voltage sensor 11, but while the secondary battery state detecting device 1 is attached, for example, a connection part of the secondary battery state detecting device 1 is attached so that it is screwed into the terminal of the secondary battery 14, an electrical connection state thereby changes, and therefore, measured voltages are not stable as illustrated in FIG. 3(E) resulting from the change of a contact resistance. At this time, the CPU 10a finds the SOC from the voltage detected by the voltage sensor 11. Namely, there is a correlation between the voltage of the secondary battery 14 and the SOC, and therefore, the SOC is found from the voltage detected by the voltage sensor 11 based on the correlation, and is stored at the RAM 10c. In FIG. 3(F), each black circle represents a timing when the SOC is estimated. As stated above, the voltages detected by the voltage sensor 11 fluctuate violently, and therefore, the SOCs detected based on the voltages detected by the voltage sensor 11 fluctuate violently and do not become constant as illustrated in FIG. 3(F).

When the initial operation finishes, at a timing t1, the electric power supply from the secondary battery 14 to the load 19 is started, and it becomes a state in an initial operation of the load. In this state, the secondary battery state detecting device 1 becomes a surely electrically connected state relative to the secondary battery 14, and therefore, the detection value of the voltage sensor 11 does not fluctuate resulting from the change of the contact resistance. However, during the load initial operation, there is a case when the current flows in the load 19, and therefore, the voltage detected by the voltage sensor 11 slightly fluctuates as illustrated in FIG. 3(E) resulting from a voltage drop caused by internal impedance of the secondary battery 14. Therefore, as illustrated in FIG. 3(F), the value of the SOC estimated from the voltage detected by the voltage sensor 11 slightly fluctuates. The CPU 10a specifies the maximum value of the SOCs which are estimated until that time, and sets the maximum value as the initial SOC.

At a timing t2, when the operation of the load 19 finishes, it becomes a stable operation state. In this state, the power supply from the secondary battery 14 to the load decreases, and therefore, the voltage of the secondary battery 14 is gradually restored to a normal state. At this time, the estimated SOC values increase in accordance with the increase of the voltage as illustrated in FIG. 3(F), and becomes a state close to a true value. The CPU 10a specifies the maximum value of the SOCs which are estimated until that time, and set the maximum value as the initial SOC.

At a timing t3, an IG (Ignition) switch of the vehicle is operated, and the starter motor 18 is rotated, then the CPU 10a detects the operation of the IG switch, and finds the initial SOC as the SOC in the initial operation mode M1. Namely, the CPU 10a sets the maximum value of the SOCs which are estimated at the timings t1 to t3 as the initial SOC. Next, the CPU 10a compares the initial SOC and a predetermined threshold value (for example, 80%). When the initial SOC is less than the predetermined threshold value (initial SOC<80%), the CPU 10a judges that the secondary battery 14 is not normal, and for example, notifies a higher device (not-illustrated) of the state via the communication part 10d. The higher device receives the notification from the communication part 10d, and presents a message indicating that the secondary battery 14 is not normal to a presentation part. As a result, workers engaged in the assembling work are able to know that the secondary battery 14 is not normal by referring to the presented message. Note that it may be set such that the secondary battery state detecting device 1 does not judge but reports the initial SOC to the higher device, and the higher device judges to present the judged result to the presentation part.

The initial SOC at the initial operation mode M1 is found, then the CPU 10a is transit from the initial operation mode M1 to a normal operation mode M2 as illustrated in FIG. 4. In the normal operation mode M2, the CPU 10a is able to find the SOC of the secondary battery 14 by, for example, setting the initial SOC found at the initial operation mode M1 as an initial value, and adding a charge/discharge current integrated value which is calculated based on the output of the current sensor 12 to the initial SOC. Note that properties of the secondary battery 14 change depending on a temperature, and therefore, a correction process by the temperature may be executed with reference to the output of the temperature sensor 13.

Note that when the secondary battery state detecting device 1 is detached from the secondary battery 14 during an operation in the normal operation mode M2 (for example, when it is detached to exchange the battery), the normal operation mode M2 is finished, and when it is attached to the secondary battery 14 again, it starts from the initial operation mode M1.

As described above, according to the embodiment of the present invention, the beginning when the secondary battery state detecting device 1 is connected to the secondary battery 14 is set to be the initial operation mode M1, and after the initial operation mode M1 is finished (after the IG switch is operated in the above example), it is set to be the normal operation mode M2, the estimation methods of the SOC are changed in each of the operation modes, and thereby, it is possible to accurately find the SOC in each of the operation modes. As a result, in the initial operation mode M1, the SOCs are estimated in plural times based on the voltage of the secondary battery 14, the maximum value is found from among the estimated plurality of SOCs, then the maximum value is presented to the assembling workers as the SOC in the initial operation mode, and thereby, it becomes possible to accurately judge whether or not the secondary battery 14 is normal. Besides, the maximum value is found and presented, and thereby, it is possible to exclude the SOCs estimated under unstable states such as, for example, at the timings t0 to t1 and the SOCs estimated when the current is supplied to the load 19 and the voltage drops such as at the timings t1 to t2. It is thereby possible to judge based on the SOC which is closer to the true value, and therefore, it is possible to prevent that the normal secondary battery 14 is judged to be abnormal to let the secondary battery 14 in itself go to waste, or an unnecessary labor caused by the exchange occur.

Figure 5:
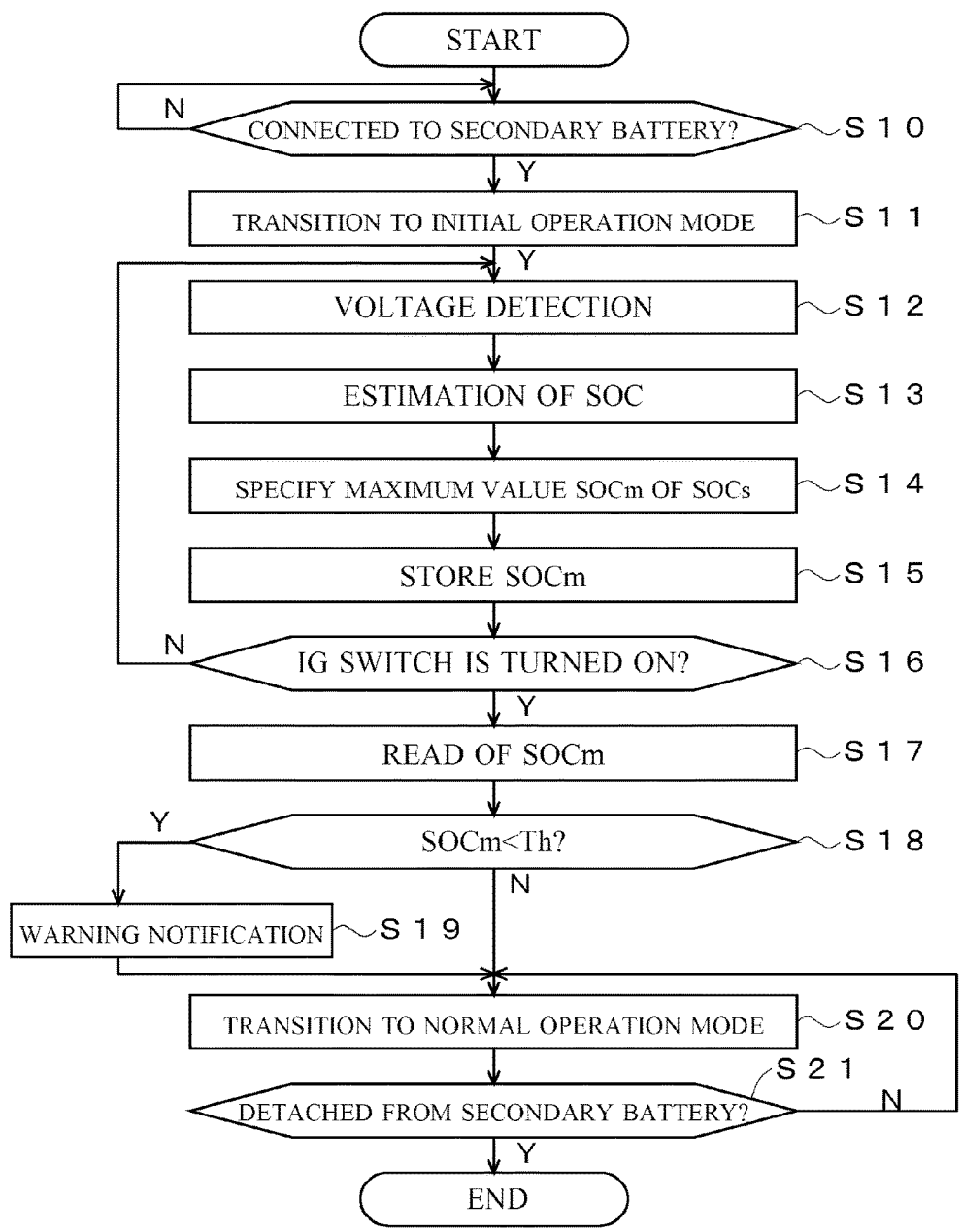
FIG. 5 is a flowchart to explain operations of the embodiment.

Next, a flow of processes executed at the control part 10 illustrated in FIG. 2 is described with reference to FIG. 5. When a flowchart illustrated in FIG. 5 is started, the following steps are executed.

At step S10, the CPU 10a refers to, for example, the output of the voltage sensor 11, judges whether or not the secondary battery state detecting device 1 is connected to the secondary battery 14, and when it is judged to be connected (step S10: Yes), the process proceeds to step S11, and in the other cases (step S10: No), the similar processes are repeated.

At the step S11, the CPU 10a is transit to the initial operation mode M1. Note that, for example, an operation mode flag is provided at the RAM 10c, and a state of this flag may be changed in accordance with the operation mode so that the operation mode at that time can be recognized.

At step S12, the CPU 10a refers to the output of the voltage sensor 11, and detects the voltage of the secondary battery 14.

At step S13, the CPU 10a estimates the SOC based on the voltage of the secondary battery 14 detected at the step S12. Note that as an estimation method, for example, a table or a relational expression representing a relationship between the voltage of the secondary battery 14 and the SOC are stored at the RAM 10c, and it is possible to find the SOC based on the table or the relational expression. Note that the SOC may be found with reference to not only the voltage but also the output of the current sensor 12. It goes without saying that the correction process by the temperature may be executed with reference to the output of the temperature sensor 13.

At step S14, the CPU 10a specifies a maximum value SOCm from among the SOCs estimated at the step S13 up to that time. Note that as a method specifying the maximum value, for example, it is enabled such that when the SOC which is newly estimated at the step S13 is larger than the value stored as the SOCm at that time, the SOC is stored as the SOCm, and in the other cases, it is left as it is.

At step S15, the CPU 10a stores the SOCm which is specified at the step S14 to the RAM 10c. Note that the estimation and storing processes of the SOCs are able to be performed, for example, at a predetermined time interval (for example, every one minute). It goes without saying that it can be set other than one minute.

At step S16, the CPU 10a judges whether or not the IG switch is turned into on state, and when it is judged that the IG switch is in on state (step S16: Yes), the process proceeds to step S17, and in the other cases (step S16: No), the process returns to the step S12, and repeats the similar processes as the above-stated case. For example, when the IG switch is turned into on state by the assembling workers, the process proceeds to the step S17.

At the step S17, the CPU 10a reads out the SOCm stored at the RAM 10c at the step S15.

At step S18, the CPU 10a judges whether or not the maximum value SOCm read out at the step S17 is less than a predetermined threshold value Th, and when it is judged to be less than the predetermined threshold value Th (step S18: Yes), the process proceeds to step S19, and in the other cases (step S18: No), the process proceeds to step S20. Note that as the threshold value Th, for example, 80% can be used. It goes without saying that a value other than this may be used.

At the step S19, the CPU 10a notifies the warning to the higher device via, for example, the communication part 10d. For example, a display indicating that the SOC is lower than the threshold value is thereby performed at the higher device, and therefore, the assembling workers are able to know that the secondary battery 14 is not normal. Then the process proceeds to the step S20.

At the step S20, the CPU 10a is transit to the normal operation mode M2. Note that in the normal operation mode M2, for example, pulse-state discharge is performed by the discharge circuit 15 at a predetermined timing (for example, at a vehicle stop time), and the state of the secondary battery 14 is detected from the terminal voltage and the discharge current at that time.

At step S21, the CPU 10a judges whether or not the secondary battery state detecting device 1 is detached from the secondary battery 14, and when it is judged to be detached (step S21: Yes), the process is finished, and in the other cases (step S21: No), the process returns to the step S20 to execute the similar processes.

According to the above-stated processes, when the secondary battery state detecting device 1 is attached to the secondary battery 14, the mode is transit to the initial operation mode M1, the SOCs are estimated based on the terminal voltage of the secondary battery 14, the SOCm being the maximum value of the SOCs is specified to be set to be the initial SOC, and is stored at the RAM 10c. When the IG switch is operated, the SOCm stored at the RAM 10c is read out, and when the SOCm is less than the predetermined threshold value Th, warning is generated to prompt attention to the workers, and thereafter, the mode is transit to the normal operation mode M2. Besides, when the SOCm is the predetermined threshold value or more, it is possible to transit to the normal operation mode M2. Note that in the flowchart described above, the SOC is newly estimated at the step S13, and at the step S14, when the newly estimated SOC is larger than the value of the SOCm, the SOC is substituted to the SOCm, to thereby find the maximum value SOCm of the SOCs. However, the plurality of SOCs estimated at the step S13 may be remained at the memory as they are, and one having the maximum value may be specified as the SOCm from among the plurality of SOCs stored at the memory. As the flowchart illustrated in FIG. 5, the SOCm is found in each time, and thereby, it is possible to reduce a capacity of the memory storing the SOCs, and therefore, it is possible to suppress a manufacturing cost of the device.

(D) Description of Modified Embodiment

The above-stated embodiment is an example only, and it goes without saying that the present invention is not limited to the above-described cases. For example, in the embodiment, the judgment is performed based on the maximum value of the SOCs which are estimated in plural times at the initial operation mode, but for example, the judgment may be performed based on an average value of the SOCs. Note that when the average value is found, the average value may be found by weighting in accordance with elapsed time. Specifically, a larger weighting may be performed in accordance with the elapsed time from the timing t0.

Figure 6:
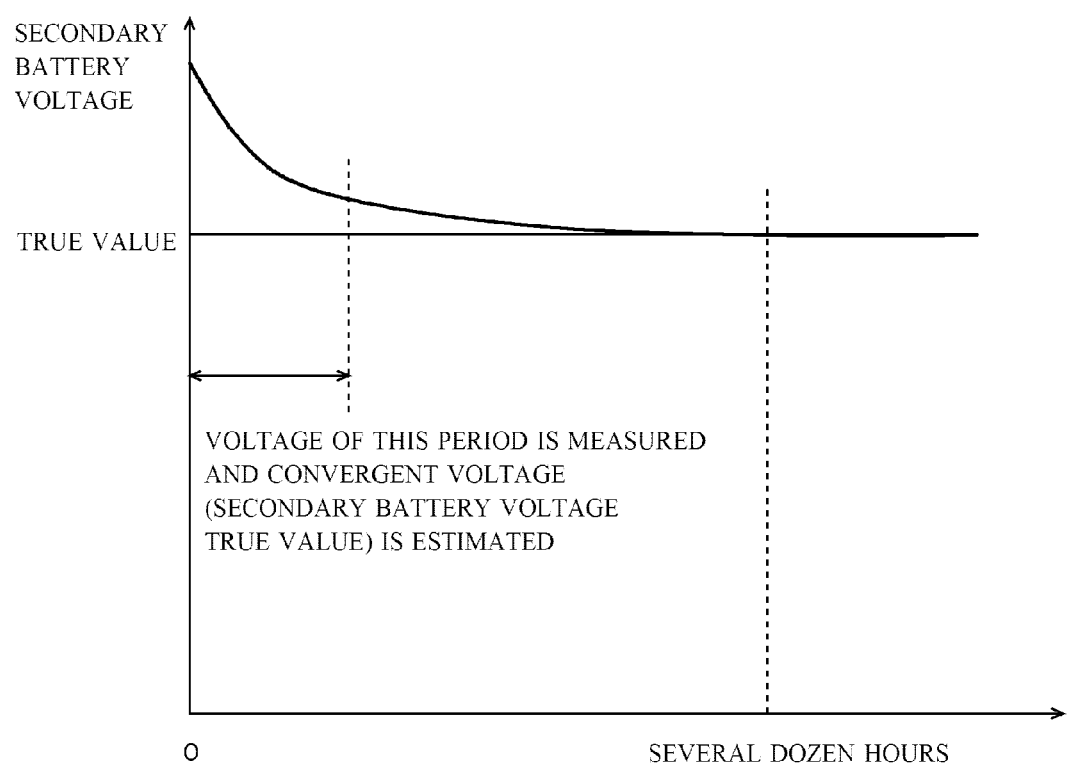
FIG. 6 is a view illustrating a change of the voltage of the secondary battery after a vehicle travel.
Figure 7:
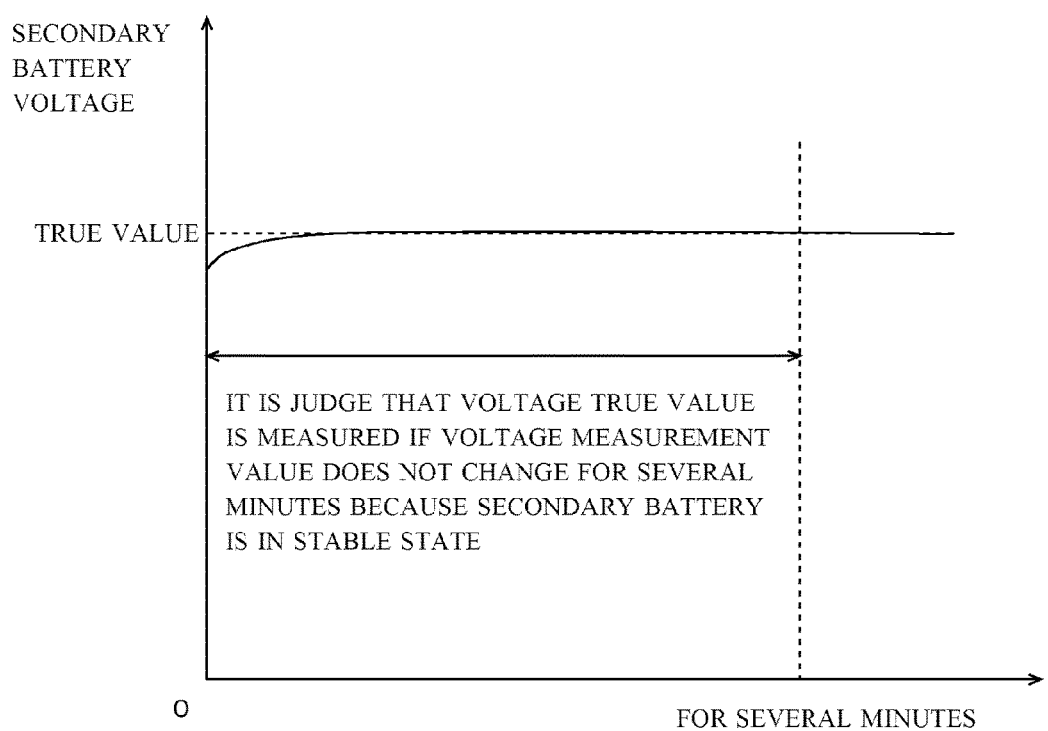
FIG. 7 is a view illustrating a change of the voltage of the secondary battery at the vehicle assembling time.

Besides, after the vehicle mounting the secondary battery 14 travels, as illustrated in FIG. 6, polarization occurs at the secondary battery 14, and a time nearly several dozen hours is necessary until this polarization falls. Therefore, conventionally, the voltage is measured at a predetermined period illustrated in FIG. 6, the true value is estimated from the change of the voltage, and the SOC is found based on the estimated value. On the other hand, at the assembling time of the vehicle, a large charge current and discharge current do not flow for the secondary battery 14, and therefore, as illustrated in FIG. 7, when the current flowing in the load 19 decreases at the load initial operation, the voltage of the secondary battery 14 converges to the true value in a short period of time (for example, in a few minutes). Accordingly, after the current for the load 19 decreases, the voltage is measured for a predetermined time (for a few minutes), and the SOC may be estimated by using the voltage when the change of the voltage becomes less than a predetermined threshold value. Note that the operation of the IG switch by the workers may be prohibited until the change of the voltage becomes less than the predetermined threshold value and the SOC is estimated.

Besides, in the above-stated embodiment, the voltage during the load initial operation is used for the estimation of the SOC, but for example, a detection value of the current sensor 12 is referred to, and the estimation of the SOC may be suspended when the discharge current flows. It is thereby possible to suspend the estimation of the SOC during the load initial operation.

Besides, in the above-stated embodiment, the warning is generated when the SOC is less than the predetermined threshold value, but the judgment may be left for the assembling workers by presenting the measured SOCs.

Besides, in the above-stated embodiment, the warning is immediately generated when the SOC is less than the predetermined threshold value, but when it is judged to be abnormal, the measurement operation of the SOC may be re-executed for one or plural times, and when it is also judged to be abnormal by the re-execution, the abnormal state may be notified. According to such a constitution, it is possible to reduce an erroneous judgment as much as possible.

Besides, the initial SOC measured in the initial operation mode is stored at the RAM 10c, and when a request is made from other devices, the initial SOC may be read out and presented, and it may be notified that an inspection of the initial SOC is passed. According to such a constitution, it is possible to know that the initial inspection is already executed and the SOC at that time, and therefore, for example, identification of a cause becomes easy even when some problems occur after a vehicle delivery.

EXPLANATION OF REFERENCE SIGNS 1 secondary battery state detecting device
10 control part
10a CPU (initial state detecting unit, normal state detecting unit)
10b ROM
10c RAM
10d display part
10e I/F
11 voltage sensor
12 current sensor
13 temperature sensor
14 secondary battery
15 discharge circuit
16 alternator
17 engine
18 starter motor
19 load

The invention claimed is:

1. A secondary battery state detecting device, comprising:
a processor; and
a memory that stores executable instructions that, when executed by the processor, facilitate performance of operations, comprising:
in response to entering an initial operation mode, determining an initial state of a secondary battery based on a terminal voltage of multiple terminal voltages measured for the secondary battery, wherein the initial operation mode occurs in response to connecting the secondary battery to the secondary battery state detecting device; and
in response to entering normal operation mode, determining a normal state of the secondary battery based on the terminal voltage and a current of the secondary battery measured at a determined time after the entering the normal operation mode.

2. The secondary battery state detecting device according to claim 1, wherein the entering the normal operation mode is from the initial operation mode and occurs in repose to an ignition switch being turned into on state.

3. The secondary battery state detecting device according to claim 1, wherein, in response to the initial state of the secondary battery being determined to be an abnormal initial state, causing information indicating the abnormal initial state to be communicated to another device.

4. The secondary battery state detecting device according to claim 1, wherein the terminal voltage of the multiple terminal voltages is an average terminal voltage corresponding to an average value of the multiple terminal voltages measured for the secondary battery.

5. The secondary battery state detecting device according to claim 1, wherein the terminal voltage of the multiple terminal voltages is a maximum terminal voltage corresponding to a maximum value of the multiple terminal voltages measured for the secondary battery.

6. A secondary battery state detecting method, comprising:
determining, by a system comprising a processor, an initial state of a secondary battery, wherein the determining the initial state is based on a determined terminal voltage of a plurality of a terminal voltages measured for the secondary battery between a first time and a second time, wherein the first time coincides with connecting the secondary battery to the system via a measurement device, and wherein the second time coincides with an ignition operation of a vehicle connected to the measurement device;
causing, by the system, an alert to be generated in response to determining that the initial state corresponds to an abnormal initial state; and
determining, by a system in response to transitioning from an initial mode to a normal mode, a normal state of the secondary battery, wherein the determining is based on the terminal voltage and a charge/discharge current of the secondary battery determined at a determined time after the transitioning to the normal mode occurs.

* * * * *